United States Patent [19]

Mori et al.

[11] Patent Number: 4,848,273
[45] Date of Patent: Jul. 18, 1989

[54] EPITAXIAL GROWTH METHOD AND APPARATUS THEREFOR

[75] Inventors: Hidefumi Mori, Tokyo; Nobuyori Tsuzuki, Kanagawa; Mitsuo Yamamoto, Tokyo, all of Japan

[73] Assignee: Nippon Telegraph & Telephone Corporation, Tokyo, Japan

[21] Appl. No.: 91,786

[22] Filed: Sep. 1, 1987

Related U.S. Application Data

[63] Continuation of Ser. No. 12,836, Feb. 10, 1987, abandoned.

[30] Foreign Application Priority Data

Feb. 14, 1986 [JP] Japan .................. 62-28974

[51] Int. Cl.$^4$ .............................. C23C 16/00
[52] U.S. Cl. .................... 118/729; 118/715
[58] Field of Search ............... 118/715, 729

[56] References Cited

U.S. PATENT DOCUMENTS

| | | | |
|---|---|---|---|
| 3,312,570 | 4/1967 | Ruehrwein | 148/175 |
| 3,312,571 | 4/1967 | Ruehrwein | 148/175 |
| 3,594,242 | 7/1971 | Burd et al. | 148/175 |
| 4,088,515 | 5/1978 | Blakeslee | 148/175 |
| 4,204,893 | 5/1980 | Cox | 148/175 |
| 4,253,887 | 3/1987 | Jolly | 427/87 |
| 4,407,694 | 10/1983 | Eu et al. | 156/606 |
| 4,488,914 | 12/1984 | Qunilan et al. | 148/175 |
| 4,561,916 | 12/1985 | Akiyama et al. | 148/175 |
| 4,579,609 | 4/1986 | Reif et al. | 148/175 |
| 4,588,451 | 5/1986 | Vernon | 148/175 |
| 4,629,532 | 12/1986 | Yanase et al. | 156/612 |
| 4,645,689 | 2/1987 | Cox | 427/87 |
| 4,664,743 | 5/1987 | Moss | 156/613 |
| 4,736,705 | 4/1988 | Weyburne | 118/725 |

FOREIGN PATENT DOCUMENTS

085846 2/1978 Japan .
169317 4/1984 Japan .
60-50169 3/1985 Japan .

OTHER PUBLICATIONS

Journal article entitled "Growth of GaAs on Si by MOCVD", by Masahiro Akiyama et al., Journal of Crystal Growth 69 (1984) 21-26, North Holland, Amsterdam.

Primary Examiner—Richard Bueker
Attorney, Agent, or Firm—Perman & Green

[57] ABSTRACT

In an epitaxial growth method of this invention, a first gas consisting of a hydrogen diluted gas containing a Group V element is continuously flowed on a monocrystalline substrate that is placed in a reaction chamber, the monocrystalline substrate is arranged in a gas mixing region where the first gas and a second gas containing a halogenide of a Group III element are mixed adjacent to the monocrystalline substrate, and a Group III-V compound semiconductor is grown on the monocrystalline substrate.

6 Claims, 7 Drawing Sheets

EPITAXIAL GROWTH METHOD AND APPARATUS THEREFOR

This is a division of co-pending application Ser. No. 012,836, filed on 2/10/87, now abandoned.

BACKGROUND OF THE INVENTION

The present invention relates to a method and apparatus for epitaxially growing a Group III-V compound semiconductor on a monocrystalline substrate.

As a method for epitaxially growing a Group III-V compound semiconductor on a monocrystalline substrate, a vapor phase epitaxy (VPE) method, a metal organic chemical vapor deposition (MOCVD) method, and a molecular beam epitaxy (MBE) method are known. In a hydride VPE method, a Group III material is converted to a halogenide, and is supplied into a reaction tube together with $H_2$ diluted gas containing a Group V element so as to grow a Group III-V compound semiconductor on a substrate. By this method, in the case of homo-epitaxial growth wherein a crystal is grown on a substrate of the same type material, a crystalline film having a high purity and good crystallinity can be easily obtained. Therefore, this method is widely applied to the manufacture of a Group III-V compound (e.g., GaAs, GaP, InP, and the like) semiconductor device.

The conventional hydride VPE method in the case of GaP growth will not be described with reference to FIGS. 11(A) and 11(B). Ga 3 of a Group III material stored in a boat 2 and a GaP monocrystalline substrate 4 are arranged inside a reaction tube 1. An electrical oven (not shown) is arranged around the reaction tube 1, so as to keep the temperature distribution inside the reaction tube, as shown in FIG. 11(B). A gas mixture 6 containing $PH_3$ and $H_2$ is introduced from an introduction tube 5 inside the reaction tube and a gas mixture 7 containing HCl and $H_2$ is introduced through a gas inlet (not shown). The introduced HCl reacts with the heated Ga.

A gas mixture 8 containing $H_2$ and GaCl produced by the reaction given by reaction formula (1) is supplied toward downstream side. $PH_3$ is decomposed into $P_4$, and is mixed with the gas mixture 8 containing GaCl and $H_2$ in a baffle 9 placed on a high-temperature area, thereby forming a gas mixture 10 containing $P_4$, GaCl, and $H_2$. The gas mixture 10 passes by the high-temperature region and then flows into the low-temperature region. As the temperature of gas mixture 10 is reduced, GaP grows on the GaP monocrystalline substrate 4 placed on the low-temperature region by the reaction expressed by reaction formula (2).

In the case of homo-epitaxial growth wherein GaP is to be grown on the substrate 4 of a GaP single crystal, GaP can be grown epitaxially as described above. When an Si single crystal is used as the substrate 4, GaP cannot be grown for the following reasons. The reaction tube is normally made of silica glass ($SiO_2$) because of its good heat resistance and machinability. When HCl is brought into contact with the silica glass which is heated to high temperature, $H_2O$ is produced by the following reaction:

(where n=0 to 3)

$H_2O$ is supplied above the Si substrate on the downstream side together with the $H_2$ gas and reacts with Si, thereby producing $SiO_2$. The thus produced $SiO_2$ covers the Si substrate surface and prevents from GaP growth on the Si substrate.

The article of H. Huber and G. H. Winstel (Siemens Forschungs und Entwichlungsberichte; 2 (1973) pp. 171-174) describes an example wherein an electrical oven for annealing is provided in addition to the growth electrical oven, the Si substrate is annealed in the $H_2$ atmosphere to remove a natural oxide film, and immediately thereafter, the substrate is moved to a growth region so as to grow GaP. However, in this case, since the substrate is exposed to the HCl atmosphere at high temperature of about 800° C., formation of $SiO_2$ on the Si substrate cannot be avoided. For this reason, growth reproducibility is poor, and even if grown, the resultant crystal has a poor crystallinity and cannot be used as a substrate of practical device.

For the above reasons, the hetero-epitaxial growth of the Group III-V compound semiconductor on the Si substrate has not yet been realized by the epitaxial growth method containing halogenide such as HCl.

There are several attempts to grow Group III-V compound semiconductor on Si substrate by the MOCVD or MBE. However, these methods cannot provide a crystal having crystallinity comparable to that of a crystal which is homo-epitaxially grown by the epitaxial growth method containing a halogenide.

M. Akiyama et al. reported a GaAs crystal which is grown on an Si substrate by the MOCVD method (Journal of Crystal Growth, Vol. 68, pp. 21-26, 1984). With this report, a GaAs film which was deposited on the Si substrate by decomposing trimethyl gallium and $AsH_3$ at 400° C. was annealed at 750° C., and mirror-surface like monocrystalline GaAs could be obtained. However, even when GaAs was grown on the resultant GaAs film by a conventional method, such as the MOCVD or hydride VPE method, the resultant crystal could not provide the same crystallinity as that of a crystal which was grown on a GaAs substrate. It was revealed from impurity analysis in the depth direction of the resultant film that $CH_3$ as a constituting molecule of trimethyl gallium is left in the film without being decomposed and degrades the crystallinity since a first film is deposited at a low temperature of 400° C.

Attempt for developing a device for integrating many or various functions on an identical substrate has been made. For example, an optical-electronic device in which optical devices and electronic devices are integrated on an identical substrate is known. When devices made of different materials are integrated on an identical substrate, in order to fabricate the next device so as not to impair the previously fabricated device, the steps for growing the respective materials must be performed at low temperature. However, in the conventional method, when growth is carried out under the condition of decreased substrate temperature, a crystal is deposited on a region of the inner wall of the reaction tube corresponding to a temperature, at which the growth is conventionally performed, on the upstream side of the substrate position, and no crystal is grown on the substrate. In this manner, hetero-epitaxial growth for integrating many or various functions on an identical substrate cannot be grown by the conventional hydride VPE method.

SUMMARY OF THE INVENTION

It is a principal object of the present invention to provide a epitaxial growth method and an apparatus therefor, which can grow a Group III-V compound semiconductor with high quality on a monocrystalline substrate.

It is another object of the present invention to provide an epitaxial growth method and an apparatus therefor, which can grow a uniform Group III-V compound semiconductor on a monocrystalline substrate.

In order to achieve the above objects, there is provided an epitaxial growth method wherein a first gas consisting of a hydrogen diluted gas containing a Group V element is continuously flowed on a monocrystalline substrate that is placed in a reaction chamber, the monocrystalline substrate is arranged in a gas mixing region where the first gas and a second gas containing a halogenide of a Group III element are mixed adjacent to the monocrystalline substrate, and a Group III-V compound semiconductor is grown on the monocrystalline substrate.

According to another aspect of the present invention, there is provided an epitaxial growth method comprising: the first step of flowing a first gas consisting of a hydrogen diluted gas containing a Group V element on a monocrystalline substrate that is placed in a reaction chamber, flowing a second gas containing a halogenide of a Group III element along a flow path different from that of the first gas, placing the monocrystalline substrate on a gas mixing region where the first and second gases are mixed, and growing a Group III-V compound semiconductor on the monocrystalline substrate; and the second step of further growing a Group III-V compound semiconductor on the Group III-V compound semiconductor grown by the first step.

According to still another aspect of the present invention, there is provided an epitaxial growth apparatus comprising: a first flow path, formed in a reaction chamber, for flowing a first gas consisting of a hydrogen diluted gas containing a Group V element; a second flow path, formed in the reaction chamber, for flowing a second gas containing halogenide of a Group III element; and a support member for a monocrystalline substrate arranged in the reaction chamber, end portions of the first and second flow paths in the reaction chamber being arranged so as to constitute a mixing region where the first and second gases are mixed, and the support member displacing the monocrystalline substrate in the mixing region, so as to allow growth of a Group III-V compound semiconductor on the surface of the monocrystalline substrate.

BRIEF DESCRIPTION OF THE DRAWINGS

FIGS. 1(A) and 1(B) show an epitaxial growth apparatus according to an embodiment of the present invention, in which

FIGS. 4(A) and 4(B) show an epitaxial growth apparatus according to another embodiment of the present invention, in which

DESCRIPTION OF THE PREFERRED EMBODIMENTS

EXAMPLE 1

An embodiment of the present invention will now be described with reference to the accompanying drawings.

Figure 1:
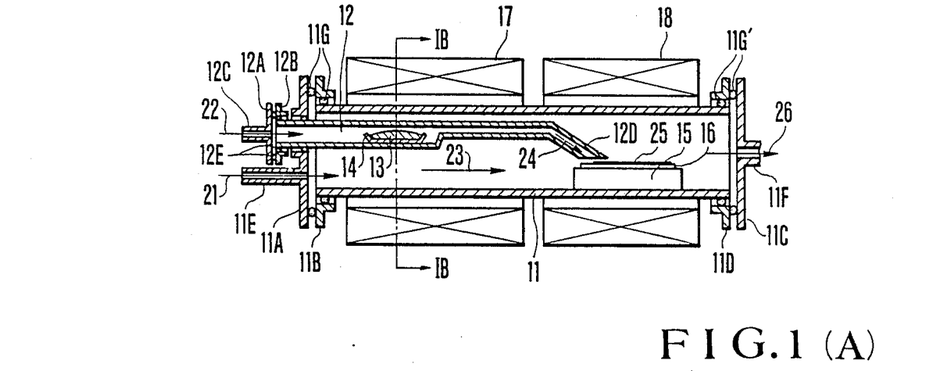
FIG. 1(A) is a sectional view taken along a longitudinal direction of the apparatus.
FIG. 1(B) is a sectional view taken along a line IB—IB in FIG. 1(A)
FIG. 1(C) is a graph showing a temperature distribution of the apparatus.
Figure 2A:
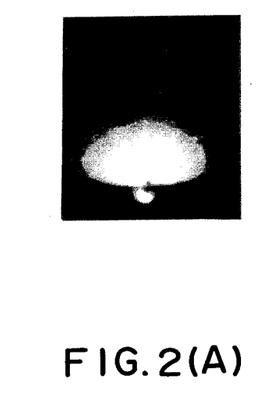
FIGS. 2(A) to 2(D) are reflection high energy electron diffraction (RHEED) photographs of a GaP crystal which is grown by the method of the present invention.
Figure 2B:
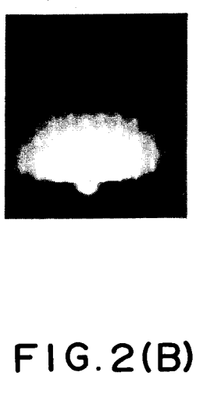
Figure 2C:
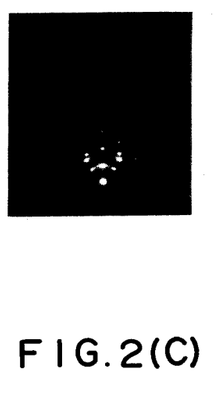
Figure 2D:
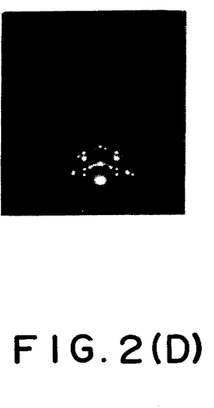

FIGS. 1(A) and 1(B) show an epitaxial growth apparatus according to an embodiment of the present invention, and FIG. 1(C) shows a temperature distribution in the apparatus. Referring to these figures, a reaction tube 11 which is made of silica glass constitutes a double tube structure together with a Group III element source chamber (to be referred to simply as a source chamber hereinafter) 12 made of silica glass. The reaction tube 11 need not have a cylindrical shape as shown in FIG. 1(B) but can have other sectional shapes. The sectional shape of the source chamber 12 need not be a semicircular shape as shown in FIG. 1(B) but can be other proper shapes such as a rectangular shape. The two ends of the reaction tube 11 are shielded from an outer atmosphere respectively by a lid 11A, a flange 11B, and an O·ring 11G, and a lid 11C, a flange 11D, and an O-ring 11G'. A gas inlet 11E is formed on the lid 11A, and a gas outlet 11F is formed on the lid 11C. One end portion of the source chamber 12 is shielded from an outer atmosphere by a lid 12A, a flange 12B, and an O-ring 12E. A gas inlet 12C is formed on the lid 12A. The other end portion of the source chamber 12 has an opening portion 12D which is open to the reaction tube 11. The opening portion 12D has a downwardly inclined portion, and its opening end is formed to be substantially parallel to the surface of a substrate (to be described later) which is arranged therebelow. A Group III element 13 is stored in the source chamber 12 while being housed in a boat 14. A substrate support table 15 is arranged below the opening portion 12D in the reaction tube 11, and a substrate 16 on which a crystal is to be grown is supported thereby. Reference numerals 17 and 18 denote electrical ovens for heating the reaction tube 11. The seal method of the two ends of the reaction tube 11 and locations of the gas inlet and the gas outlet are not limited to those illustrated in FIGS. 1(A) and 1(B), and various other known methods can be used.

A method for growing GaP on an Si monocrystalline substrate having a (111) plane using the apparatus shown in FIGS. 1(A) and 1(B) will now be described.

Ga is used as the Group III element 13. The surface of the Si substrate 16 having a (111) plane is cleaned by chemical etching or the like, and a natural oxide film formed on the surface is removed by a hydrogen fluoride (HF) solution. Then, the substrate 16 is set on the substrate support table 15. A gas mixture 21 containing phosphine ($PH_3$) and hydrogen ($H_2$) as source materials of a Group V element is introduced from the gas inlet 11E into the reaction tube 11 and an $H_2$ gas 22 is introduced from the gas inlet 12C into the source chamber 12. After air inside the apparatus has been sufficiently substituted by the introduced gases, the reaction tube 11 is heated. The temperature distribution of the reaction tube 11 is as shown in FIG. 1(C). More specifically, the electrical ovens 17 and 18 are controlled such that high temperature is obtained at the position of the Ga 13 and low temperature is obtained at the position of the substrate 16. When desired temperature distribution is obtained, e.g., when a Ga temperature ($T_S$) reaches 500° C. to 900° C., preferably, 750° C. to 850° C. and a substrate temperature ($T_G$) reaches 400° to 800° c., preferably, 600° c., hydrogen chloride (HCl) gas is flowed from the gas inlet 12C to convert the gas flow 22 to be a gas mixture containing ($HCl+H_2$). $PH_3$ contained in the gas flow 21 is decomposed by heat to be a gas flow 23 containing ($P_4+H_2$). Meanwhile, HCl produces GaCl by reaction given by reaction formula (1) and forms a gas flow 24 containing ($GaCl+H_2$). The gas flow 24 containing the Group III element Ga and the gas flow 23 containing the Group V element P flow along independent flow paths, and are mixed near the opening portion 12D of the source chamber 12. Thus, a GaP crystal 25 is grown on the substrate by reaction given by reaction formula (2). An exhaust gas 26 is exhausted from the gas outlet 11F.

With the method of this example, the substrate surface before crystal growth is exposed to a ($PH_3+H_2$) or ($P_4+H_2$) atmosphere and, hence, will not be oxidized. GaCl and $P_4$ pass by a high temperature region separately, and produce GaP near the low-temperature substrate. Therefore, a high degree of super saturation of crystal growth can be realized, and hence, a high growth rate can be achieved. The atmosphere surrounding the substrate has a low oxygen content, and $H_2O$ produced by reaction given by reaction formula (3) reaches the substrate after the growth of the crystal. Therefore, the substrate will not be oxidized, and the GaP crystal onto the Si substrate can grow satisfactorily.

The Si substrate 16 is located immediately below the opening portion 12D. A distance between the substrate surface and the opening portion 12D is preferably as short as possible so as not to interfere with the reaction given by reaction formula (2) after the gas flows 23 and 24 are mixed. In this example, the distance from the surface of the substrate 16 to the opening portion 12D is about 2 mm.

The GaP crystal growth starts upon introduction of HCl, and is stopped when the introduction of HCl is stopped. When the Ga temperature was 850° C., the $PH_3$ flow rate was $5\times10^{-5}$ mol/min, and the HCl flow rate was $5\times10^{31\ 5}$ mol/min, and the substrate temperature was 600° C., a 0.35-μm thick GaP crystal was grown in five minutes. When the substrate temperature was changed while other conditions remained the same, the GaP crystal growth was possible within the substrate temperature range of 350° C. to 800° C. FIGS. 2(A) to 2(D) show reflection high energy electron diffraction (RHEED) images of the GaP crystal which was grown as described above. As the substrate temperature increases, the resultant crystal has good crystallinity. A GaP single crystal having the same (111) plane as that of the substrate can be obtained at the substrate temperature of 350° C. or higher. Even if the Ga temperature is changed from 500° C. to 900° C., the growth rate and the crystal quality are not so affected.

Figure 3:
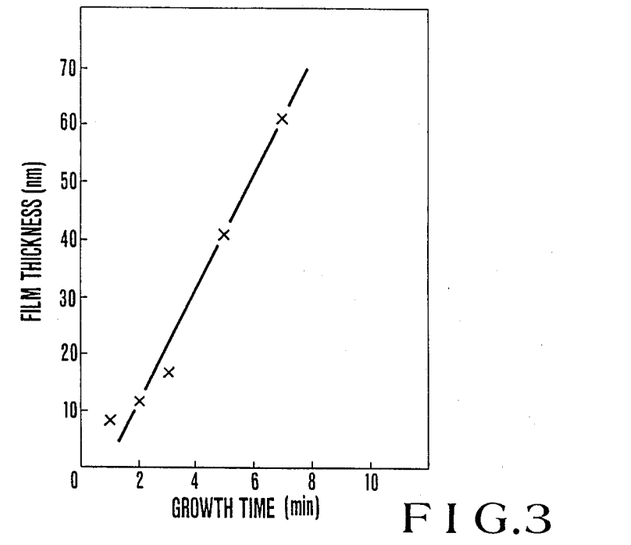
FIG. 3 is a graph showing the relationship between a growth time and a film thickness of GaP which is grown on an Si (111) substrate.

FIG. 3 shows the relationship between a growth time and the thickness of a grown crystal film. The temperature of the Si substrate is 350° C. A GaP thickness on the Si (111) plane is increased in proportion to a growth time.

In this example, the opening portion 12D has the downwardly inclined portion and its opening end is substantially parallel to the substrate surface. However, the opening end of the downwardly inclined portion need not be parallel to the substrate. In addition, the opening portion 12D need not be inclined downward, but can extend to be parallel to the substrate surface. Furthermore, the opening portion 12D can have a tapered nozzle portion whose opening faces the substrate surface.

EXAMPLE 2

Figure 4A:
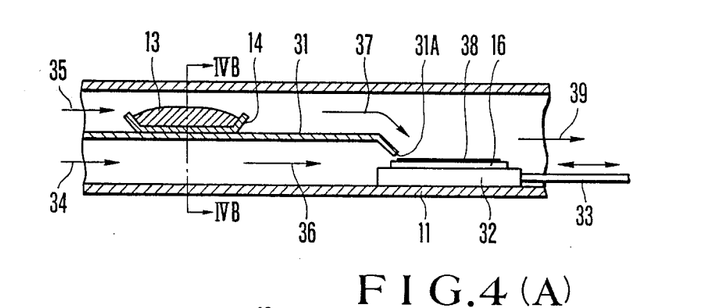
FIG. 4(A) is a sectional view taken along a longitudinal direction of the apparatus.
Figure 4B:
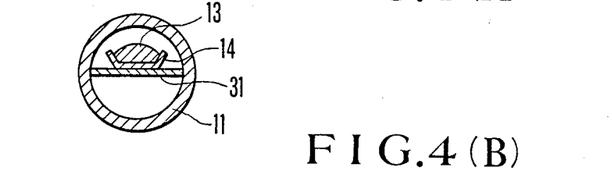
FIG. 4(B) is a sectional view taken along a line IVB—IVB in FIG. 4(A)

FIGS. 4(A) and 4(B) show an epitaxial growth apparatus according to a second embodiment of the present invention. Differences between the first and second embodiments are that the interior of the reaction tube 11 is partitioned by a partition wall 31 and that a substrate support table 32 is movable inside the reaction tube by means of a substrate moving rod 33. The seal method of the two ends of the reaction tube 11, the locations of the gas inlet and the gas outlet, and the electrical ovens for heating the reaction tube 11 are the same as those in the first embodiment, and are omitted from FIGS. 4(A) and 4(B).

The Group III element 13 is stored in the boat 14 and is placed on the partition wall 31. An end portion 31A of the partition wall 31 on the downstream side of the gas flow is bent downward to guide the gas flow above the partition wall downward. The substrate support table 32 can be moved under the end portion 31A of the partition wall 31. The temperature inside the reaction tube 11 is controlled by the electrical ovens so that the high temperature is obtained at the position of the Group III element and the low temperature is obtained at the position of the substrate, in the same manner as shown in FIG. 1(C).

A GaAs crystal was grown on an Si (111) substrate using the apparatus shown in FIGS. 4(A) and 4(B). The substrate 16 whose surface was cleaned in the same manner as described in Example 1 was located below the end portion 31A of the partition wall 31, as shown in FIG. 4(A). Ga was used as the Group III element. A gas mixture 34 containing arsine ($AsH_3$) and $H_2$ was flowed below the partition wall 31, and an $H_2$ gas 35 was flowed thereabove. After air inside the reaction tube 11 had been sufficiently substituted, the reaction tube 11 was heated. After the temperature distribution inside the reaction tube as shown in FIG. 1(C) was obtained such that the Ga portion was at high temperature and the substrate position was at low temperature, for example, after the Ga portion ($T_S$) reached 850° C. and the substrate temperature ($T_G$) reached 300° C. to 700° C, HCl was mixed with the gas flow 35 to form a gas mixture containing ($HCl+H_2$). $AsH_3$ in the gas flow 34 was mainly decomposed in the form of $As_4$ by heat, and formed a gas mixture flow 36 containing ($As_4+H_2$). Meanwhile, HCl was reacted with Ga to produce GaCl, and formed a gas mixture flow 37 containing ($GaCl+H_2$). The gas flow 37 containing the Group III element Ga and the gas flow 36 containing the Group V element As were flowed along independent flow paths, and were mixed for the first time near the end portion 31A of the partition wall 31. Then, these two gases reacted and a GaAs crystal 38 was grown on the substrate 16. Reference numeral 39 denotes an exhaust gas. GaAs precipitation and growth are started upon introduction of HCl, and is stopped when the introduction is stopped. After the Ga temperature was 850° C., the substrate temperature was 600° c., the $AsH_3$ flow rate was $5\times10^{-5}$ mol/min, and the HCl gas was flowed for five minutes at the flow rate of $5\times10^{-5}$ mol/min, the reaction tube 11 was cooled and then the substrate 16 was unloaded. A 0.35-$\mu$m thick GaAs crystal was grown on the substrate. When the resultant crystal was observed by RHEED, the resultant crystal was a single crystal having the same (111) plane as that of the substrate when the temperature of the substrate 16 was 300° C. or higher.

The GaAs crystal growth can be started and stopped not only by introduction of the HCl gas but also by moving the substrate. More specifically, the substrate support table 32 is located below the partition wall 31 so that the substrate 16 does not contact with the gas flow 37, the reaction tube 11 is heated to a desired temperature, and the HCl gas is mixed in the gas flow 35. In this state, the substrate support table 32 is moved to a position shown in FIG. 4(A), and the gas flows 36 and 37 can be mixed and reacted near the substrate surface. After a predetermined period of time has passed, when the substrate support table 32 is moved below the partition wall 31 so as to separate the substrate from the gas mixing region, the GaAs growth is stopped. The quality of the resultant GaAs crystal and the growth rate in this case are the same as those when the crystal growth is controlled by introduction of the HCl gas.

The end portion 31A of the partition wall 31 on the downstream side of the gas flow is bent downward, so that the sectional area of the flow path of the gas flow 36 adjacent to the gas mixing region near the end portion 31A of the partition wall 31 is decreased. As a result, the velocity of the gas flow 36 is increased through the narrow region, and an undesirable reverse flow of a gas and the like toward the flow path of the gas flow 36 can be prevented.

The moving mechanism of the substrate support table can be added to the apparatus shown in FIG. 1(A).

EXAMPLE 3

A GaP crystal was grown on an Si (100) substrate using the apparatus shown in FIG. 4(A). A substrate 16 was located at a position below the partition wall 31 so as not to contact the gas flow 37. Only an $H_2$ gas was flowed as the gas flows 34 and 35. After air inside the reaction tube 11 was sufficiently substituted, the reaction tube was heated by the electrical ovens to keep the temperature of the substrate 16 at 800° C. to 1,000° C. for 15 minutes, so that contamination, a natural oxide film, and the like on the substrate were removed by cleaning. The temperature distribution inside the reaction tube was controlled as shown in FIG. 1(C), so that the Ga source portion was set at high temperature and the position of the substrate was set at low temperature. In this example, the temperature $T_S$ was kept at 800° C., and the temperature $T_G$ was kept at 350° C. to 450° C. A gas mixture 34 containing $PH_3$ and $H_2$ and a gas mixture 35 of HCl and $H_2$ were introduced. After the gas flows were stabilized, the substrate was moved to the downstream side of the end portion 31A of the partition wall 31, as shown in FIG. 4(A), and this state was maintained for five minutes. The gas flow 36 containing $P_4$ and the gas flow 37 containing GaCl were mixed and reacted near the end portion 31A, and as a result, GaP was grown on the substrate 16.

In this first step, a uniform amorphous GaP layer was grown on the Si substrate. The thickness of the GaP layer varies in accordance with the $PH_3$ and HCl flow rates and the substrate temperature. When the $PH_3$ flow rate was 0.1 ml/min and the HCl flow rate was 0.5 ml/min, the thickness was 20 nm.

Thereafter, the substrate 16 on which the GaP layer was grown was returned to a position at which it could not contact with the gas flow 37, e.g., a position below the partition wall 31, and HCl introduction was then stopped. In order to prevent P of the GaP layer deposited on the substrate 16 from evaporating, the gas mixture flow 34 of $H_2$ diluted gas containing Group V element was flowed and then the substrate temperature was increased to 600° C. to anneal the substrate. The gas mixture containing HCl and $H_2$ was again introduced. After the gas flow was stabilized, the substrate 16 was moved to the downstream side of the end portion 31A of the partition wall 31, and second-step growth was carried out. 10 minutes later, a 0.5-$\mu$m thick GaP monocrystalline layer was grown on the substrate 16. The resultant crystal had a full width at half maximum of 40" of the X-ray rocking curve of the double crystal method. Thus, it was demonstrated that the resultant crystal had good crystallinity equivalent to that of a crystal which was homo-epitaxially grown on a normal GaP substrate.

According to this embodiment, since the epitaxial layer is grown by moving the substrate 16 under the end portion 31A of the partition wall 31, a uniform semiconductor film can be grown.

Figure 5:
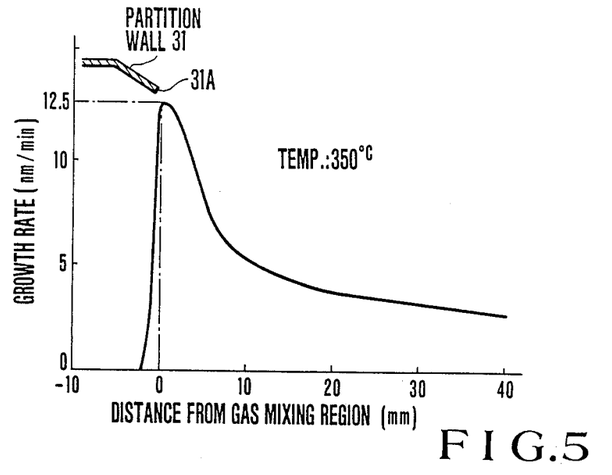
FIG. 5 is a graph showing semiconductor growth rate characteristics in a gas mixing region and a downstream side region thereof.

FIG. 5 shows a GaP growth rate characteristic on a substrate around a gas mixing region and a downstream region thereof. As can be seen from this characteristic, the semiconductor growth rate around the gas mixing region near the end 31A of the partition wall 31 is noticeably high. Since this rate is much higher than a rate at which an oxide film is formed on the substrate surface, hetero-epitaxially grown semiconductor with high quality can be obtained with high yield.

Since the sectional area of the flow path of the gas flow 36 adjacent to the gas mixing region is smaller than the other portion of the flow path of the gas flow 36, a gas such as HCl which adversely affects the substrate cannot flow to the upstream side of the gas flow 36 from the gas mixing region. For this reason, the substrate surface will not be contaminated with such gas before, during, and after semiconductor epitaxial growth onto the substrate.

Figure 6:
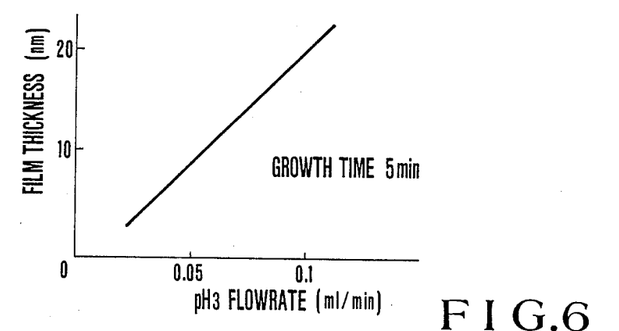
FIG. 6 is a graph showing the relationship between a film thickness of GaP grown on an Si (100) substrate and a $PH_3$ flow rate.
Figure 7:
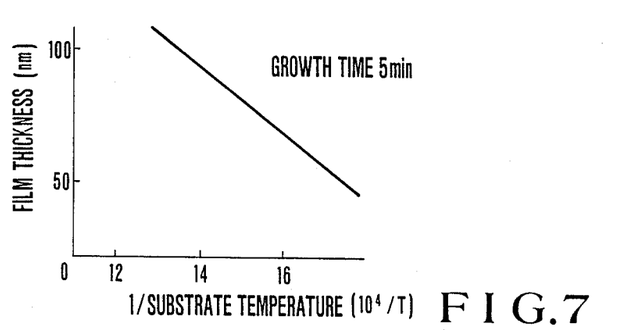
FIG. 7 is a graph showing the relationship between a film thickness of GaP grown on an Si (100) substrate and a substrate temperature.

As described above, the thickness of the GaP layer in the first-step growth varies in accordance with the growth conditions. When the PH$_3$ flow rate is increased, the film thickness is increased as shown in FIG. 6. When the PH$_3$ and HCl flow rates were respectively fixed at 0.1 ml/min and 0.5 ml/min, the film thickness was increased as the substrate temperature increased, as shown in FIG. 7. The film thickness shown in FIGS. 6 and 7 corresponds to that after a growth time of five minutes has passed.

Figure 8A:
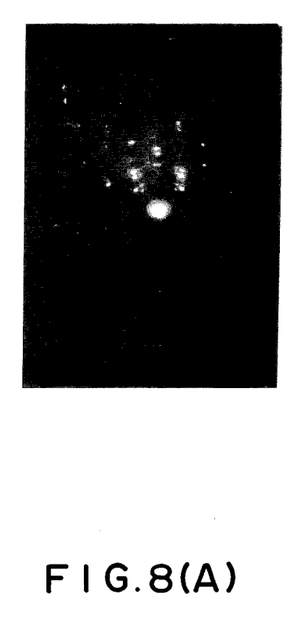
FIGS. 8(A) to 8(C) are reflection electron beam diffraction photographs of a GaP crystal which is grown on an Si (100) substrate by two-step growth of the present invention.
Figure 8B:
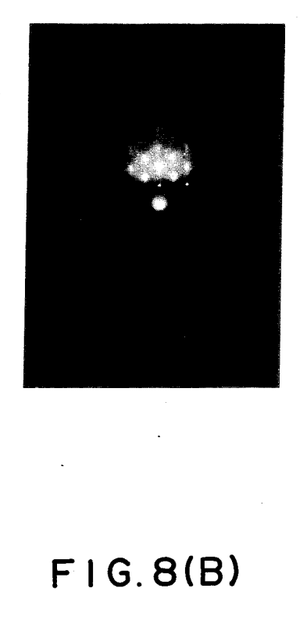
Figure 8C:
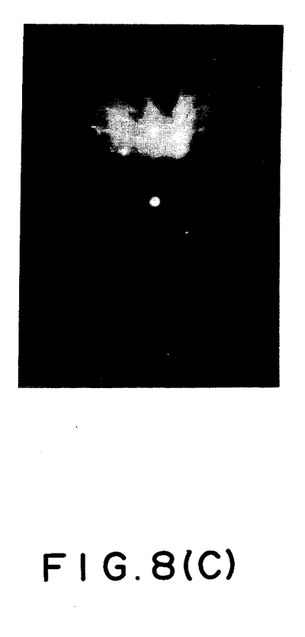

FIGS. 8(A), 8(B), and 8(C) respectively show RHEED patterns of the GaP layers which were respectively obtained at the substrate temperatures of 500° C., 600° C., and 700° C. It is demonstrated that as the substrate temperature increases, crystallinity is improved, and a single crystal GaP having the same (100) plane as that of the substrate can be obtained at the substrate temperature of 600° C. or higher. It can be considered that the grown film is annealed upon an increase in temperature during transition from the first to second step, and the crystallinity is improved, thereby facilitating the growth in the second step.

Further more, after the amorphous GaP layer was grown on the substrate which was kept at 350° C., the substrate was not moved, and the HCl flow was stopped, thereby stopping GaP growth. Thereafter, the substrate temperature was increased up to 600° C. Thereafter, the HCl gas was again introduced to grow a GaP crystal on the substrate. The full width at half maximum of the X-ray rocking curve of the double crystal method was the same as that of the GaP crystal obtained in the second-step growth by moving the substrate.

EXAMPLE 4

GaP was epitaxially grown on an Si (100) substrate in combination of the method shown in Example 3 and the conventional method. After the first-step growth of GaP in Example 3, the substrate 16 was unloaded from the reaction tube. As described above, in this step, GaP on the Si (100) substrate is amorphous. GaP was then grown on this substrate by the conventional method.

Figure 11A:
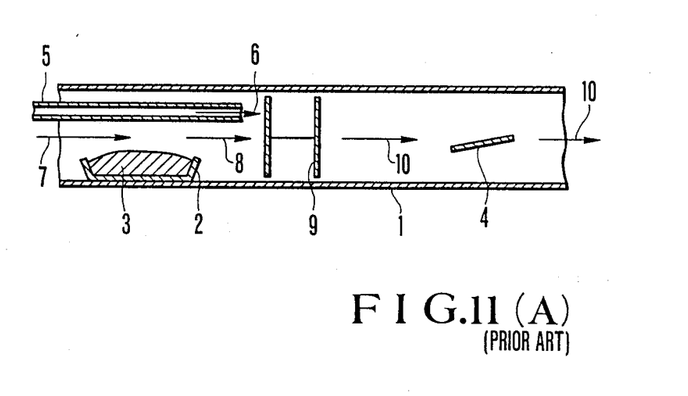
FIG. 11(A) is a sectional view of a conventional epitaxial growth apparatus.
Figure 11B:
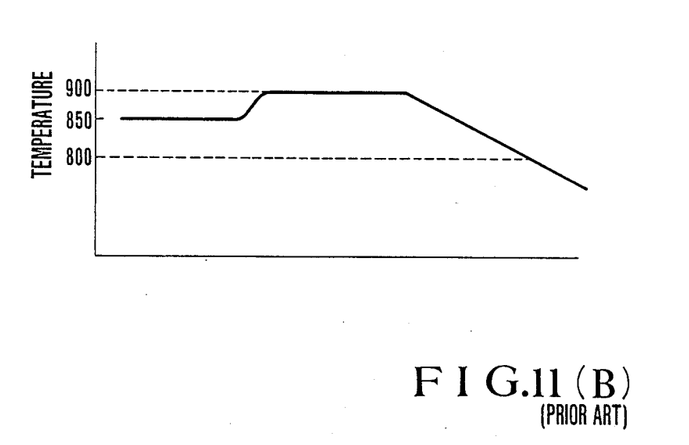
FIG. 11(B) is a graph showing a temperature distribution of the apparatus shown in FIG. 11(A).

The substrate on which the amorphous GaP layer was grown was placed at a position of the substrate 4 in the conventional apparatus shown in FIG. 11. Then, the temperature conditions shown in FIG. 11(B). i.e., the temperature at the position of the Ga source 3 of 900° C., the substrate temperature of 750° C. to 800° C., and the temperature gradient at the position of the substrate of 5 to 10° C./cm were set while supplying the gas mixture 6 containing PH$_3$ and H$_2$ from the supply tube 5. Then, the gas mixture 7 containing HCl and H$_2$ was supplied to initiate epitaxial growth. After the epitaxial growth was performed for 20 minutes under the conditions of the PH$_3$ and HCl flow rates of 1 ml/min, respectively, a 1-μm thick GaP monocrystalline layer was grown on the substrate. The crystallinity of the resultant crystal was the same as that of the crystal shown in Example 3. The same result was obtained when the second-step growth was conducted by the MOCVD method using trimethyl gallium and PH$_3$.

In Examples 3 and 4, the first-step growth is started and stopped upon movement of the substrate. Alternatively, the substrate can be initially located at the downstream side of the end portion 31A of the partition wall 31, and after the interior of the reaction tube 11 is set in the temperature distribution, i.e., the Ga source temperature is set at 800° C. and the substrate temperature is set at 350° C., amorphous GaP having a desired thickness can be grown on the substrate upon introduction of HCl. Thereafter, when the second-step growth was performed in accordance with the above examples, a single crystal having the same crystallinity could be obtained.

Group III-V compound semiconductor heteroepitaxial growth on an Si substrate depends on that oxidation of an Si surface is suppressed to allow growth of a first Group III-V Compound semiconductor this film layer.

In the second-step growth of the present invention, the first layer is grown on the Si (100) substrate at a relatively low temperature, as described above. When the first layer is grown at a high temperature of 500° C. or higher, an oxygen component which is contained in the HCl gas and is produced by reaction of the reaction tube and HCl is reacted with Si before growth of the GaP layer. Thus, the oxygen component forms an SiO$_2$ layer on the Si surface, and interferes with growth of the GaP layer. When the substrate temperature is set at 450° C. or lower, the GaP growth rate becomes faster than the SiO$_2$ growth rate, and a uniform film can be formed.

Figure 9:
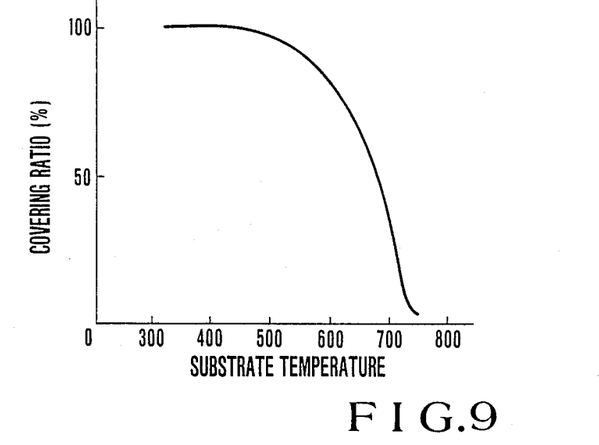
FIG. 9 is a graph showing the relationship between a substrate covering ratio with a GaP layer and a substrate temperature.

FIG. 9 is a graph showing the relationship between the substrate temperature and a covering ratio of the Si (100) substrate with the GaP layer. FIG. 9 reveals that a region on which no GaP is deposited is formed on the substrate at about 500° C. Therefore, in order to obtain a uniform GaP film, growth must be performed at 450° C. or lower. The film which is grown at 450° C. or lower does not always have good crystallinity and found to have a quality between polycrystalline (450°) and amorphous (350°) upon observation by RHEED. Therefore, the film cannot be utilized for manufacturing a device such as an LED.

In the present invention, the second step is carried out at a temperature at which a film is to be grown normally by the VPE method, and after the amorphous or polycrystalline film of the first step is annealed, the GaP layer having good crystallinity can be grown thereon. This crystal can be utilized for manufacturing a device such as an LED.

EXAMPLE 5

Figure 10A:
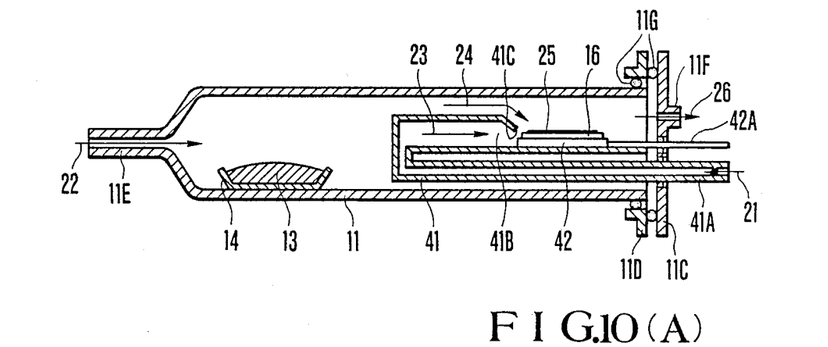
FIGS. 10(A) and 10(B) are sectional views showing an epitaxial growth apparatus according to still another embodiment of the present invention.

FIG. 10(A) is a sectional view of an epitaxial growth apparatus according to another embodiment of the present invention. The same reference numerals in FIG. 10(A) denote the same parts as in FIG. 1(A), and a detailed description thereof will be omitted. Although the electrical ovens for heating the reaction tube 11 is omitted, they are controlled to head the reaction tube to obtain the temperature distribution as shown in FIG. 1(C).

The principal difference between this embodiment and the embodiment shown in FIG. 1(A) is a gas introduction portion of a gas (containing a Group V element) (to be referred to as a Group V gas introduction portion hereinafter). A Group V gas introduction portion 41 has a gas inlet 41A at one end thereof. A supplied gas 21 is returned by the other end of the Group V gas introduction portion and continues to flow. The returning portion corresponds to a storage portion 41B of the substrate support table 42. An end portion 41C of the storage portion 41B is bent downward so as to guide a gas flow 24 containing a Group III element downward. The two gas flows 23 and 24 are mixed and reacted at first time near the end portion 41C. The substrate support table 42 can be moved by the moving rod 42A inwardly and outwardly with respect to the storage portion 41B. A height from the substrate 16 supported on the substrate support table 42 to the end portion 41C must fall within the range within which mixing of the gas flows 23 and 24 is not interfered, and is preferably 1 mm to several cm and more preferably 2 to 5 mm. The gas inlet 11E of the reaction tube 11 can have the same arrangement as that of FIG. 1(A).

This embodiment has good operability such as easy change of the type of a Group III element or a substrate used, easy cleaning of the interior of the reaction tube, and the like. The epitaxial growth of the Group III-V semiconductor using the apparatus of this embodiment can be performed in the same manner as in Examples 2 to 4.

Figure 10B:
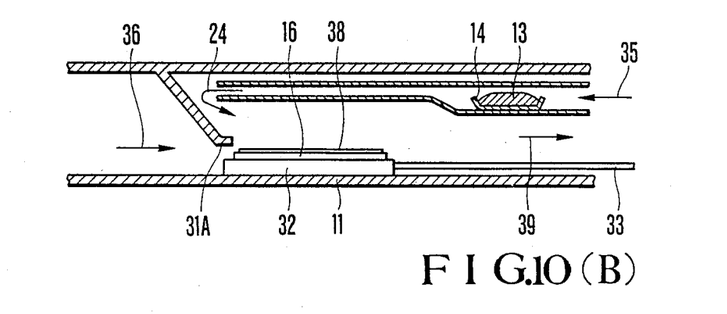

FIG. 10(B) is a sectional view for explaining another embodiment for supplying gas flows in opposing directions. The same reference numerals in FIG. 10(B) denote the same parts as in FIGS. 4 and 10(A). The operation of this embodiment is substantially the same as that in the embodiment shown in FIG. 10 (A), except that a gas flow 35 flowing through the source chamber is returned by the partition wall in the opposite direction and is then mixed with a gas flow 36 in the vicinity of an end portion 31A.

HBr or HI can be used instead of HCl as a gas which reacts with the Group III element and produces a halogenide gas.

The hetero-epitaxial growth wherein a diffent material such as a Group III-V compound is grown on an Si substrate has been described. The present invention can be applied to homo-epitaxial growth wherein a crystal is grown on a substrate of the same type of material, as a matter of course. The two-step crystal growth according to the present invention can be applied to other planes and other substrates in addition to the Si (100) substrate, and can advantageously improve the quality of a grown crystal.

According to the present invention as described above, a substrate is placed in an H$_2$ gas atmosphere containing a Group V element, and a gas containing a Group III halogenide is mixed with the H$_2$ gas containing a Group V element immediately above the substrate, so as to grow a crystal. Therefore, a Group III-V compound semiconductor can be hetero-epitaxially grown on an Si substrate.

Therefore, electronic and optical devices using GaP, GaAs, and the like can be manufactured using an inexpensive Si substrate instead of an expensive Group III-V compound semiconductor substrate.

Since a Group III-V compount semiconductor crystal can be grown at a low substrate temperature of 600° C. or lower, a highly functional device which is constituted by different materials and is arranged on an identical substrate can be realized.

What is claimed is:

1. An epitaxial growth apparatus comprising:
    a first flow path, formed in a reaction chamber, for flowing a first gas containing a hydrogen diluted gas containing a Group V element;
    a second flow path, formed in said reaction chamber, for flowing a second gas containing a halogenide of a Group III element; and
    a support member for a monocrystalline substrate arranged in said reaction chamber,
    end portions of said first and second flow paths in said reaction chamber being arranged so as to constitute a gas mixing region wherein said first and second gases are mixed, and
    said support member displacing said monocrystalline substrate between said first flow path and said gas mixing region such that growth of a Group III-V compound semiconductor on the surface of said monocrystalline substrate is allowed.

2. An apparatus according to claim 1, wherein said support member for said monocrystalline substrate is movable between said gas mixing region and a region that only said first gas flows.

3. An apparatus according to claim 1, wherein the end portion of said first flow path adjacent to said gas mixing region has a smaller sectional area than that of the other portion of said flow path.

4. An apparatus according to claim 3, wherein said support member for said monocrystalline substrate is movable between said gas mixing region and the region that only said first gas flows.

5. An apparatus according to claim 1, wherein said first flow path is arranged parallel to said second flow path.

6. An apparatus according to claim 1, wherein a gas inlet of said first flow path is formed in said reaction chamber so as to face a gas inlet of said second flow path.

* * * * *